United States Patent
Norton et al.

(10) Patent No.: US 10,359,816 B2
(45) Date of Patent: Jul. 23, 2019

(54) BLIND MATE SLEDS AND BASES FOR STORAGE DEVICES

(71) Applicant: Hewlett Packard Enterprise Development LP, Houston, TX (US)

(72) Inventors: John Norton, Houston, TX (US); Mark V. Kapoor, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/746,715

(22) PCT Filed: Jul. 31, 2015

(86) PCT No.: PCT/US2015/043303
§ 371 (c)(1),
(2) Date: Jan. 22, 2018

(87) PCT Pub. No.: WO2017/023286
PCT Pub. Date: Feb. 9, 2017

(65) Prior Publication Data
US 2018/0217642 A1    Aug. 2, 2018

(51) Int. Cl.
| | |
|---|---|
| H05K 5/00 | (2006.01) |
| H05K 7/00 | (2006.01) |
| G06F 1/18 | (2006.01) |
| H01R 13/447 | (2006.01) |
| H01R 13/621 | (2006.01) |
| H01R 13/631 | (2006.01) |
| H01R 43/26 | (2006.01) |
| H05K 7/14 | (2006.01) |

(52) U.S. Cl.
CPC .......... *G06F 1/187* (2013.01); *H01R 13/447* (2013.01); *H01R 13/621* (2013.01); *H01R 13/631* (2013.01); *H01R 43/26* (2013.01); *H05K 7/1401* (2013.01); *H05K 7/1487* (2013.01)

(58) Field of Classification Search
CPC ....................................................... G06F 1/16
See application file for complete search history.

(56) References Cited

U.S. PATENT DOCUMENTS

| | | |
|---|---|---|
| 6,302,714 B1 | 10/2001 | Bolognia |
| 6,317,334 B1 | 11/2001 | Abruzzini |
| 6,490,153 B1 | 12/2002 | Casebolt |

(Continued)

FOREIGN PATENT DOCUMENTS

| | | |
|---|---|---|
| CN | 203720736 U | 7/2014 |
| WO | WO-0157604 A1 | 8/2001 |

OTHER PUBLICATIONS

"HP Proliant Bl460c Server Blade," Jun. 30, 2006, 28 pps.
"Installing a USB Flash Key," Retrieved from Internet, Jun. 5, 2015, 1 pp.

*Primary Examiner* — Jerry Wu
(74) *Attorney, Agent, or Firm* — Hewlett Packard Enterprise Patent Department

(57) ABSTRACT

An example system in accordance with an aspect of the present disclosure includes a sled to retain a storage device, and a base mountable to a computing system to slidably receive the sled. The storage device is to blind mate with a multipurpose interface of the computing system, based on the sled being slidable on the base between a retracted position and an inserted position.

19 Claims, 7 Drawing Sheets

(56) References Cited

U.S. PATENT DOCUMENTS

| | | |
|---|---|---|
| 7,283,371 B1 * | 10/2007 | Grouell .................. G06F 1/185 |
| | | 361/741 |
| 7,791,894 B2 | 9/2010 | Bechtolsheim |
| 8,001,302 B2 | 8/2011 | Sivertsen |
| 2008/0250486 A1 | 10/2008 | Gibson |
| 2011/0090633 A1 | 4/2011 | Rabinovitz |
| 2011/0287656 A1 | 11/2011 | Morgan |

* cited by examiner

BLIND MATE SLEDS AND BASES FOR STORAGE DEVICES

BACKGROUND

Computer systems can include memory, central processing unit(s) (CPUs), and subcomponents such as storage and input/output (I/O). Computer systems also can include multi-function interfaces, for enabling additional storage or other devices.

BRIEF DESCRIPTION OF THE DRAWINGS/FIGURES

DETAILED DESCRIPTION

Servers can be designed with a tradeoff between dedicating internal volume to accommodate more memory and CPUs, at the expense of less internal volume available for options and I/O. Internal storage devices, such as fixed mounted Universal Serial Bus (USB) drives/keys, can be fixedly mounted within a server above the server's memory modules due to constrained internal volume, constraining memory module selection and serviceability. A server housing such internal fixed storage needs partial disassembly of the server for installation and removal of the storage, without enabling front-access to the fixed storage. Furthermore, in addition to internal volume of the server being important, the external volume surrounding the server is important as well. For example, the server can be housed in a rack that uses an external door. The door of the rack, when closed, can contact a bezel of the server, preventing a USB key from having any space to protrude from the bezel.

To address such issues and others, examples described herein may use a sled to retain the storage device, and a base mountable to the computing system. The base is to slidably receive the sled to enable the storage device to blind mate with a multipurpose interface of the computing system. The sled is slidable on the base between a retracted position and an inserted position. In this manner, examples described herein enable a server to use a front-accessible removable storage, such as a USB key, even with servers suited for a standard rack installation while allowing the rack door to close without colliding with the USB key. Examples are applicable across different server lines, including blade servers. The removable storage is easily front-accessible, based on the blind mate enablement of storage installation at the server. The storage can be received in the server and arranged to free-up internal server volume for additional memory, CPUs, or other server components.

Figure 1:
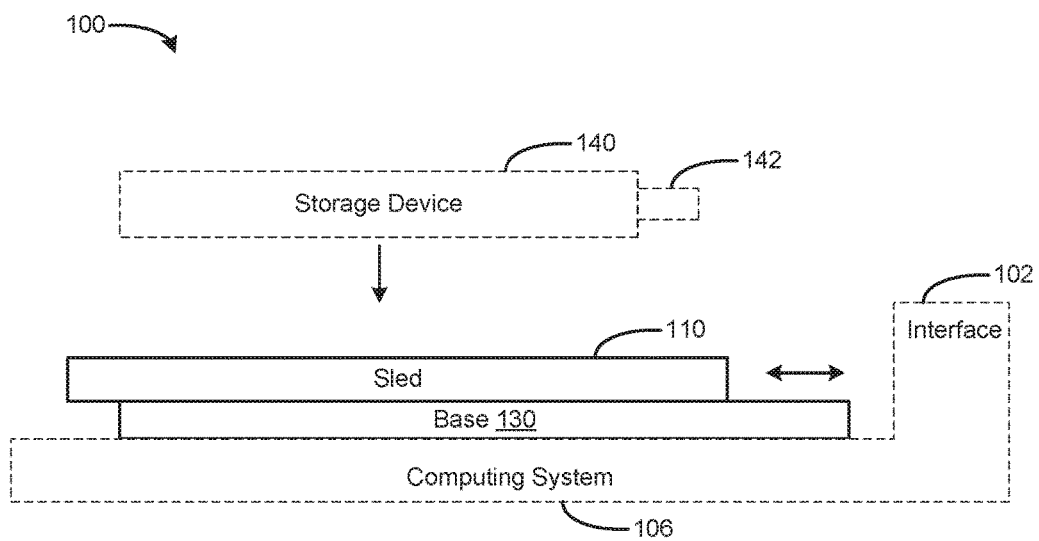
FIG. 1 is a block diagram of a system including a base and a sled according to an example.

FIG. 1 is a block diagram of a system 100 including a base 130 and a sled 110 according to an example. The sled 110 is to retain the storage device 140, which includes a connector 142. The base 130 is mountable to a computing system 106, to slidably receive the sled 110. The base 130 and sled 110 enable the storage device 140 to blind mate with an interface 102 of the computing system 106. The sled 110 is slidable on the base 130 between a retracted position (away from interface 102) and an inserted position (toward interface 102).

The base 130 can be attached to the computing system 106 via a system board, stand-up card, server chassis, or other component of the computing system 106. The blind mate enablement can be enabled by installing system 100 to a server, e.g., as a sub-assembly system 100 installable at a system board of the server. System 100 also can be retrofit to an existing server, e.g., by swapping a removable system board of the computing system to which the system 100 is mounted.

The storage device 140 can be mounted to the sled 110 based on various techniques, including a technique whereby the sled 110 retains at least a portion of the connector 142 of the storage device 140, and/or retains at least a portion of a housing of the storage device 140. For example, the sled 110 can clamp onto available space on a portion of the connector 142, e.g., using a fastener such as screws and/or other clamping mechanism. The sled 110 slidably engages with the base 130 (e.g., via engagement features not specifically shown in FIG. 1), to enable the connector 142 of the retained storage device 140 to slide into and out of the interface 102 of the computing system 106. The sled 110 and/or base 130 can include blind mating features to accommodate physical design tolerances and guide the connector 142 of the storage device 142 into the interface 102. Although illustrated as a male connector 142 and female interface 102, in alternate examples, the connector 142 may be a female connector, and the interface 102 may be a male interface. Additionally, the system 100 provides physical support and stability to the storage device 140, protecting the storage device 140 from shock and vibration conditions, including when the storage device 140 is coupled with the interface 102.

The sled 110 and/or the base 130 can be formed of various materials having characteristics suitable for slidably retaining the storage device 140, such as metals, plastics, and other materials. In an example, high density polyethylene (HDPE) or Teflon®) can be used, with favorable characteristics for long life and reduced friction for smooth slidability.

The interface 102 can include various types of multipurpose physical interfaces, such as those based on USB, FireWire, or other serial or parallel interfaces. Thus, the multipurpose nature of interface 102 enables the computing system 106 to interface with a large range of portable and removable hand-held storage devices 140, unlike hard drive docking bays or caddy-based systems that use a dedicated (i.e., non-multipurpose) interface specifically designed for that particular type of usage. The sled 110 similarly is designed to accommodate a variety of different types and physical form-factors of existing storage devices 140, without a need to custom design the storage device 140 and/or sled 110 for use with the system 100. The system 100 is compatible with server-based computing systems 106, as well as other form-factors such as desktop computing systems 106, notebook computing systems 106, and others that can accommodate storage device 140.

System 100 thereby enables computing systems 106 to make use of storage device 140 for many purposes with ease, due to the slidable sled 110 enabling blind mate interfacing with the interface 102 and retracting the storage device 140 out of the way such that it is not protruding from a front surface of the computing system 106. For example, a user may transfer files to the computing system 106 via a USB key, leaving the USB key inserted at the computing system 106 and closing a rack door of a rack housing the computing system 106 (e.g., to avoid disturbing air flow of the rack). The storage device 140 can easily be removed from the computing system 106 and/or the sled 110, and be used with another computing system such as another server and/or laptop etc. for transferring files or loading firmware etc.

Figure 2:
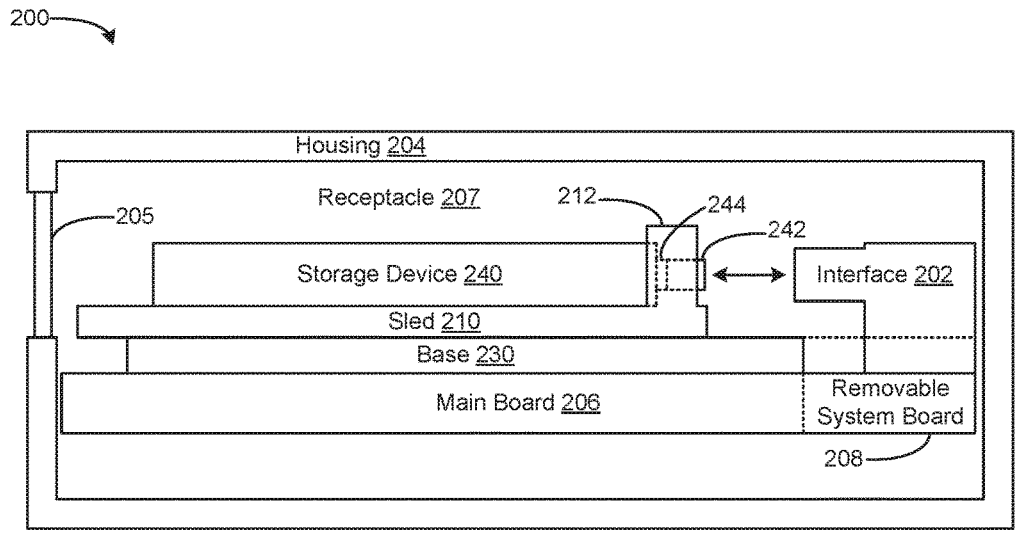
FIG. 2 is a block diagram of a system including a base and a sled according to an example.

FIG. 2 is a block diagram of a computing system 200 including a base 230 and a sled 210 according to an example. The computing system 200 also includes a housing 204 enclosing a main board 206, to which the base 230 is mounted. The sled 210 slidably engages with the base 230, slidable between a retracted position and an inserted position to enable the storage device 240 to blind mate with an interface 202 of the computing system 200. The storage device 240 is shown in an intermediate position between retracted and inserted positions, whereby the storage device 240 is contained within the receptacle 207 while disengaged from the interface 202.

The sled 210 is shown with a retaining portion 212, to retain the storage device 240 at a collar portion 244 of the connector 242 extending from the storage device 244. For example, a USB storage device 240 includes a standard portion of the connector 242 to serve as the collar 244, available for the retaining portion 212 of the sled 210 to grip, without blocking the connector 242 from engaging the interface 202. The sled 210 also may retain the storage device 240 via other contacts points, such as via a housing of the storage device 240 (e.g., along a length of the sled 210).

The retaining portion 212 can retain at least a portion of the storage device 240 based on various techniques, while still enabling the storage device 240 and sled 210 to slide relative to the base 230 and interface 202. For example, the retaining portion 212 can clamp onto the collar 244 based on fasteners such as glue, clips, snaps, latches, screws, and the like, whether removable, semi-removable, or non-removable. The retaining portion 212 may rely on non-fastener fittings, such as a press fit and/or an interference fit. The storage device 240 is to be retained at the sled 210 with sufficient retention force to resist the storage device 240 from disengaging from the sled 210 during insertion and/or removal from the interface 202.

The interface 202 can be mounted to a removable system board 208 of the computing system 200, which can be coupled to the main board 206 as shown (or otherwise form a portion of the computing system 200). Accordingly, the base 230 can remain with the computing system 200 by being mounted to the main board 206, independent of whether the removable system board 208 (along with the interface 202) is removed from the computing system 200 and/or replaced with a different system board 208. The interface 202 and/or base 230 can be surface mountable, or otherwise coupled to the computing system 200. In alternate examples, the base 230 and interface 202 can be provided as a single assembly, integrated such that the base 230 and interface 202 are mountable to the main board 206 together as a unitary assembly.

The housing 204 of the computing system 200 includes a door 205, to cover a receptacle 207 in the computing system 200 that contains the base 230, to receive the sled 210 in the receptacle 207. The door 205 may be lockable and/or spring-loaded. The sliding system enables the embedding of storage device 240 into a computing system from the front or sides of the housing 204, without a need to remove the housing 204 from the computing system 200 to service the storage device 240. The storage device 240 may be enclosed at least partially (space permitting between the extension of the storage device 240 from the housing 204 and a rack door) or fully internal to the housing 204 (e.g., if no space is permitting in the rack to allow for storage device 240 to protrude from the housing 204).

Figure 3A:
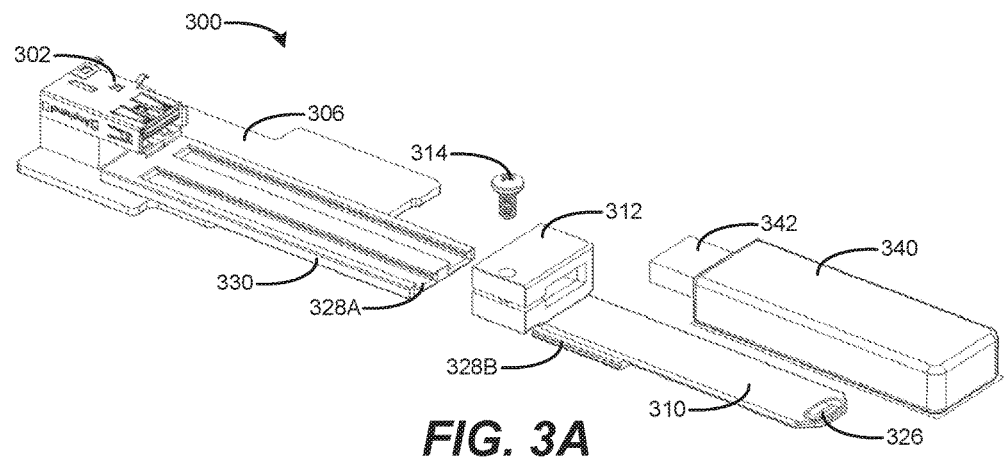
FIGS. 3A and 3B illustrate an exploded perspective view and an assembled perspective view of a system including a base and a sled according to an example.
Figure 3B:
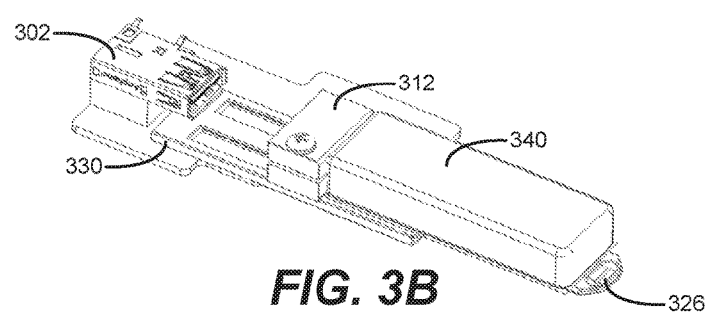

FIGS. 3A and 3B illustrate an exploded perspective view and an assembled perspective view of a system 300 including a base 330 and sled 310 according to an example. The base 330 and interface 302 are mountable to main board 306. Engagement features 328A of the base 330 are to slidably engage corresponding engagement features 328B of the sled 310. The sled 310 includes a grip 326 and a retaining portion 312, illustrated as a clamp operable via fastener (screw) 314, to retain at least a portion of the storage device 340.

The grip 326 can be formed as a pull tab or other touch point on the sled 310, to facilitate sliding the sled 310 between retracted and inserted positions, and help overcome insertion and extraction forces. The grip 326 can be formed as a divot on an end of the sled 310. The grip 326 can include a roughened section, such as ribs or other texture formed on the grip 326, to enhance grip.

The base and sled engagement features 328A, 328B enable slidable engagement between the base 330 and the sled 310. The base 330 can include at least one lead-in portion of the engagement features 328A, to accommodate alignment tolerances and facilitate insertion of and engagement between the sled 310 and the base 330. The base engagement features 328A are shown as a pair of tracks, shaped to define proper orientation and alignment of the sled 310 relative to the base 330, maintaining the sled 310 in a generally vertical orientation consistent with interfacing between the connector 342 of the storage device 340 and the interface 302 of the main board 306. The engagement features 328A, 328B can be keyed or otherwise arranged to prevent the sled 310 from engaging the base 330 at an improper orientation. For example, as illustrated, the sled engagement features 328B are arranged toward the retaining portion end of the sled 310 such that the grip end of the sled 310 prevents the sled 310 from being inserted backward into the base 330. Similarly, a track of the base engagement features 328A may be narrower than the other track, with corresponding size differences in the sled engagement features 328B, to prevent improper insertion orientation. The engagement features 328A, 328B are shown as protrusions on the sled 310 and tracks on the base 330. In alternate example, their positions on the sled 310 and base 330 can be exchanged (i.e., tracks on the sled 310 and extensions on the base 330), or formed using other features besides tracks and extensions (e.g., rails, pins, single or multiple tracks, and the like) to enable slidable retention of the sled 310 on the base 330.

In alternate examples, the base 330 can slidably entrap the sled 310, e.g., via a narrowing end section of the base engagement features 328A (or other formations), to resist and/or prevent the sled 310 from being fully removed from the base 330 after assembly of the sled 310 with the base 330. The entrapped sled 310 maintains enough movement to be moved out far enough to replace or otherwise access the storage device 340, even though the sled 310 is not fully removed from the base 330.

The interface 302 is illustrated in FIGS. 3A-7B as a USB interface, although other types of multipurpose interfaces are possible. The USB interface can be mounted and oriented horizontally with respect to the main board 306 as shown, and in alternate examples, may be mounted vertically. The entire system 300 can be mounted in a computing system in various orientations, as desired for a given computing system.

Figure 4:
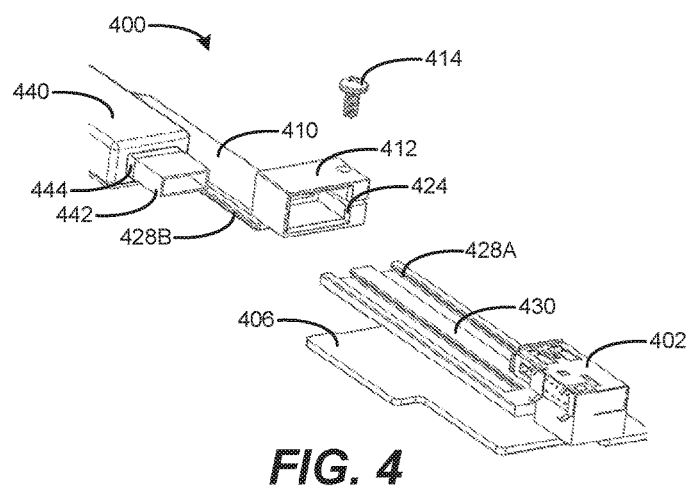
FIG. 4 is an exploded perspective view of a system including a base and a sled according to an example.

FIG. 4 is an exploded perspective view of a system 400 including a base 430 and a sled 410 according to an example. The base 430 and interface 402 are mountable to main board 406. Engagement features 428A of the base 430 are to slidably engage corresponding engagement features 428B of the sled 410. The sled 410 includes retaining portion 412, illustrated as a clamp operable via screw fastener 414, to retain a collar 444 of the connector 442 of the storage device 440 (when the connector 442 is inserted at least partially into the retaining portion 412).

The sled 410 (e.g., the retaining portion 412) can include at least one lead-in portion 424 to accommodate alignment tolerances and facilitate insertion of and/or blind mating between the sled 410 (and its retained storage device 440) and the interface 402 when the sled 410 is slid toward the interface 402. The sled lead-in 424 can be formed as a chamfer or other taper along an inside edge of the retaining portion 412 of the sled 410. Thus, the sled 410 enjoys an enhanced alignment and gatherability of the interface 402, facilitating insertion by a user without needing direct visibility. As shown, an extending portion of the interface 402 can be received inside of the retaining portion 412 of the sled 410. In alternate examples, other forms of self-alignment features may be used, such as an alignment pin and corresponding pin receptacle. The base and sled engagement features 428A, 428B can include similar lead-ins to facilitate blind mate insertion of the sled 410 into the base 430.

Figure 5A:
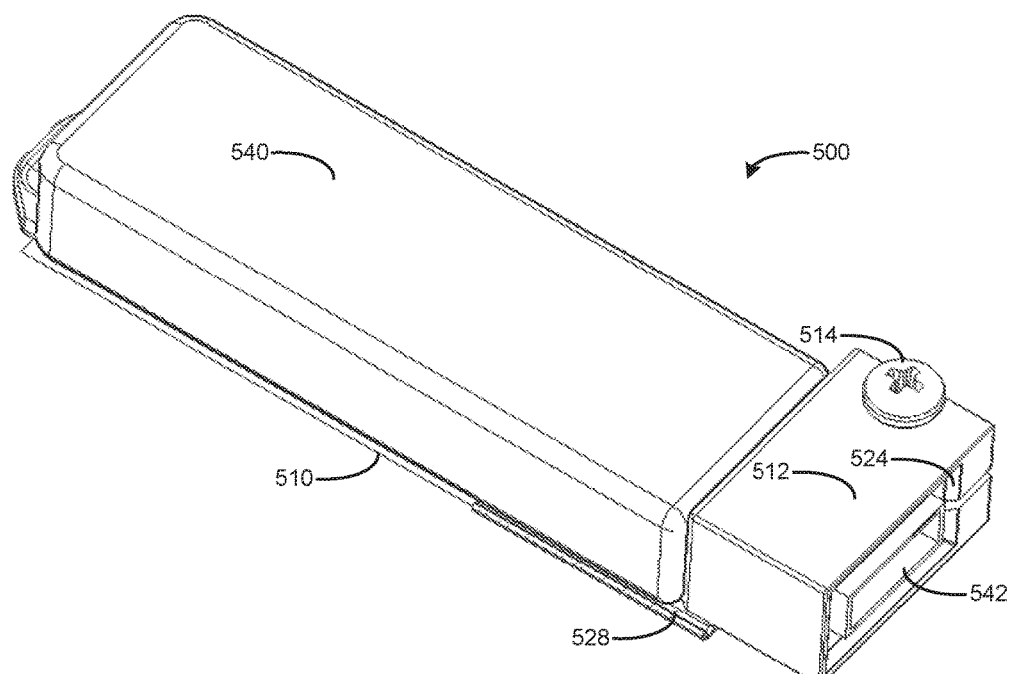
FIGS. 5A and 5B illustrate a perspective view and a perspective section view of a system including a sled retaining a storage device according to an example.
Figure 5B:
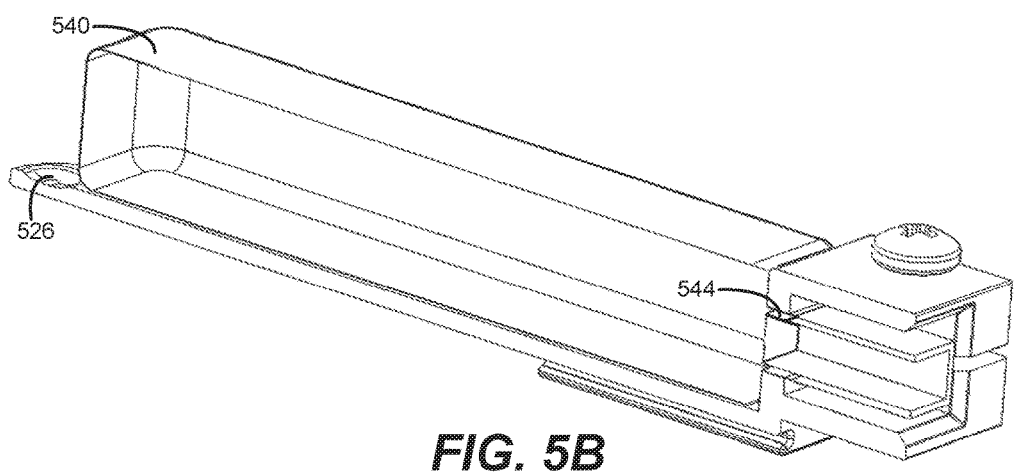

FIGS. 5A and 5B illustrate a perspective view and a perspective section view of a system 500 including a sled 510 retaining a storage device 540 according to an example. Sled engagement features 528 are shown positioned toward the retaining portion 512 end of the sled 510. The sled 510 includes grip 526. The retaining portion 512 of the sled 510 is to clamp onto a collar 544 of the storage device 540. The retaining portion 512 includes lead-ins 524, spaced from the connector 542 of the storage device 540 to facilitate blind mate alignment of the connector 542 with an interface of a computing system. The fastener 514 can reversibly tighten the retaining portion 512 of the sled 510 to clamp around at least the collar 544 portion of the connector 542.

Figure 6A:
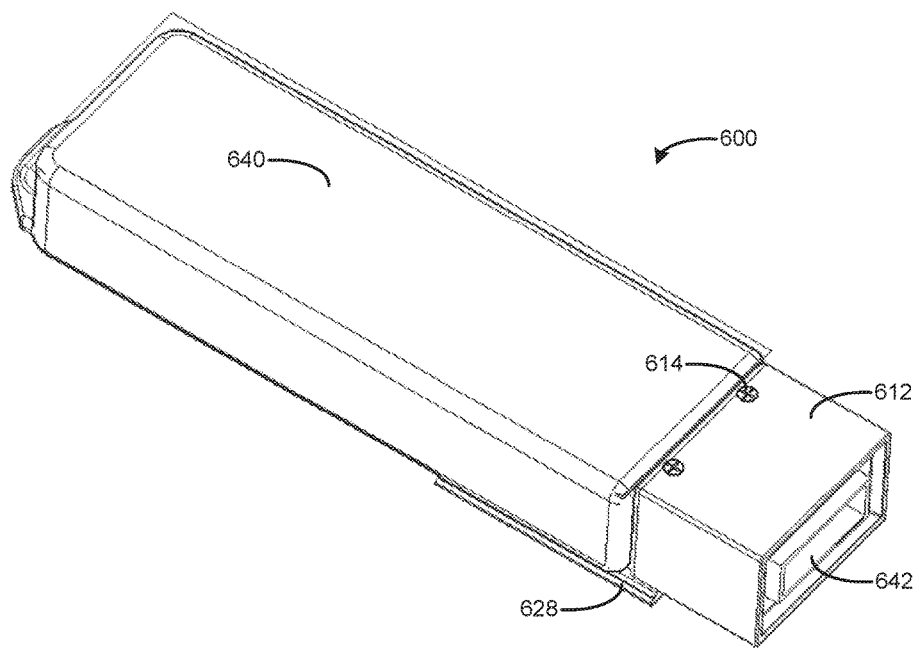
FIGS. 6A and 6B illustrate a perspective view and a perspective section view of a system including a sled retaining a storage device according to an example.
Figure 6B:
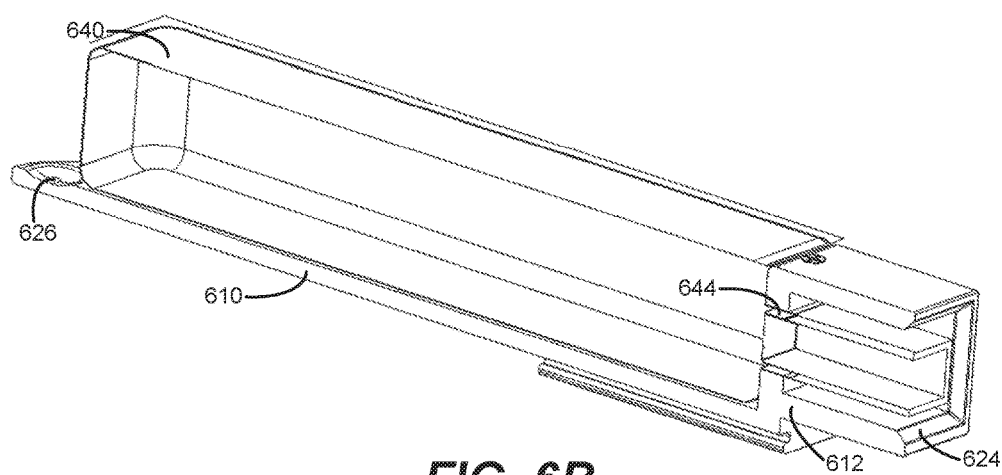

FIGS. 6A and 6B illustrate a perspective view and a perspective section view of a system 600 including a sled 610 retaining a storage device 640 according to an example. The sled 610 includes engagement features 628, grip 626, and retaining portion 612. The retaining portion 612 is formed as a collar with a plurality of fasteners 614. The fasteners 614 are illustrated as a plurality of set screws, which can be tightened to contact the collar 644 to reversibly secure the storage device 640 at the sled 610. The retaining portion 612 includes lead-ins 624, spaced from the connector 642 of the storage device 642 to facilitate blind mate alignment of the connector 642, allowing a portion of the multipurpose interface of a computing system to slide between the connector 642 of the storage device 640 and the retaining portion 612 of the sled 610.

In alternate examples, although not specifically shown as a unified structure, the storage device 640 can integrate features of the sled 610, such that the storage device 640 itself can serve as the sled 610 to slidably engage a base. For example, a housing of the storage device 640 can include a collar extension with lead-ins, similar to the retaining portion 612. The housing of the storage device 640 also can include engagement features to slidably engage tracks of a base.

Figure 7A:
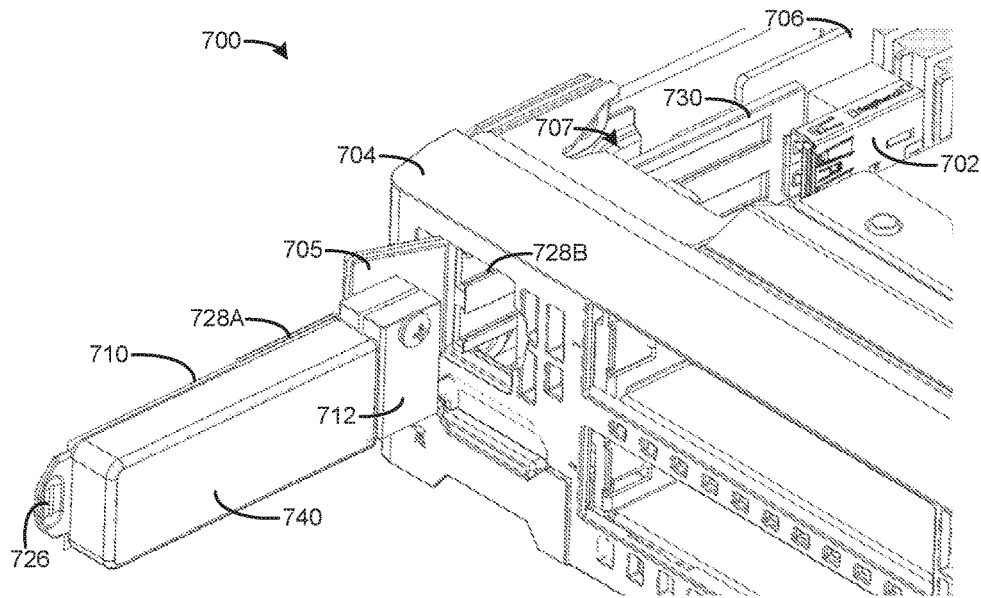
FIGS. 7A and 7B illustrate perspective views of a system including a door and a housing to receive a sled and a storage device according to an example.
Figure 7B:
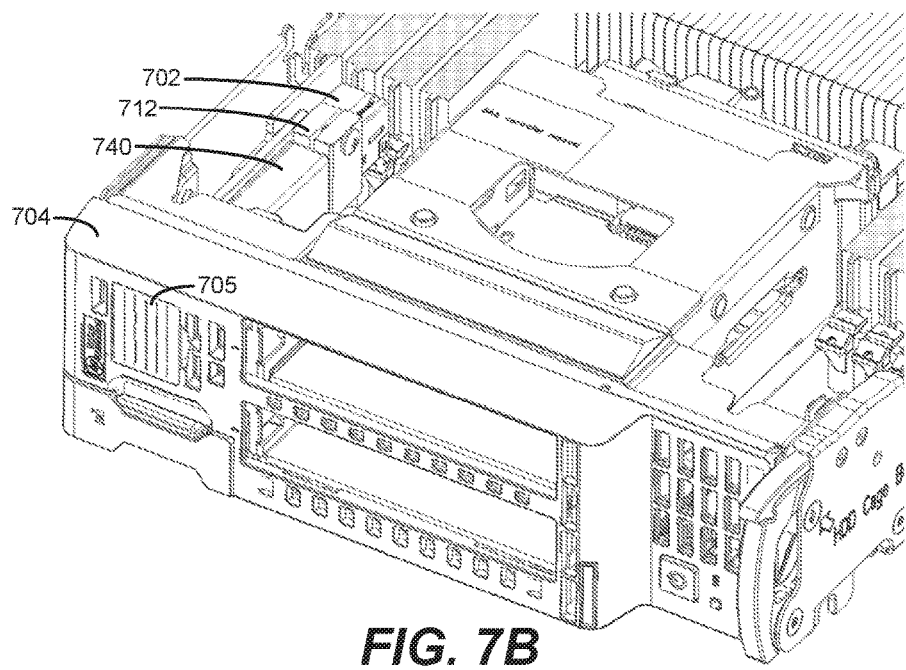

FIGS. 7A and 7B illustrate perspective views of a system 700 including a door 705 and a housing 704 to receive a sled 710 and a storage device 740 according to an example. The storage device 740 is shown clamped to the sled 710 by retaining portion 712, with the sled 710 oriented in FIG. 7A with the grip 726 away from the door 705 and the sled engagement features 728A aligned for insertion into the base engagement features 728B. The base 730 is contained within the receptacle 707 formed by the housing 704 inside the computing system 700. The base 730 is mounted to the main board 706 of the computing system, along with the interface 702. In alternate examples, the main board 706 may be a removable system board 708.

The door 705 can be sized to accommodate insertion of the storage device 740 and sled 710 (including the retaining portion 712). FIG. 7A illustrates the door 705 swinging outward. In alternate examples, the door can swing inward. The door can be spring-loaded and/or lockable, for convenience and for safely securing the storage device and preventing tampering. As shown in FIG. 7B, the storage device 740 is enclosed in the receptacle within the housing 704 with the door 705 closed, such that the retaining portion 712 has received at least a portion of the interface 702 within the retaining portion 712, to couple with the connector of the storage device 740.

Figure 8:
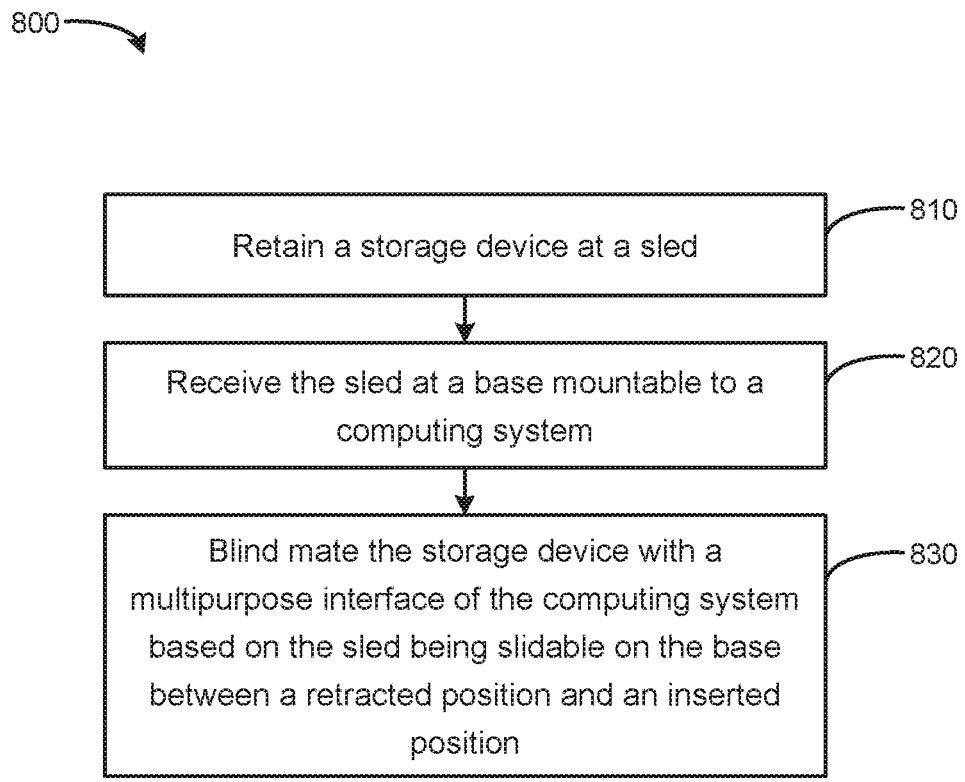
FIG. 8 is a flow chart based on blind mating a storage device with an interface of a computing system according to an example.

Referring to FIG. 8, a flow diagram is illustrated in accordance with various examples of the present disclosure. The flow diagram represents processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

FIG. 8 is a flow chart 800 based on blind mating a storage device with an interface of a computing system according to an example. In block 810, a storage device is retained at a sled. For example, a retaining portion of the sled can clamp onto a collar portion of a connector of a USB storage device. In block 820, the sled is received at a base mountable to a computing system. For example, the sled can include engagement features that slidably engage with the base, allowing the sled to slide relative to the base, while retaining the sled in the base. In block 830, the storage device is blind mated with a multipurpose interface of the computing system based on the sled being slidable on the base between a retracted position and an inserted position. For example, the sled can include lead-ins on a retaining portion surrounding the connector of the storage device, to facilitate blind mate alignment and engagement of the retaining portion (and connector) of the sled with the computer interface.

What is claimed is:

1. A system comprising: a sled to retain a storage device; a base mountable to a computing system, to slidably receive in a direction, in a horizontal position, the sled to enable the storage device to horizontally blind mate with a universal serial bus (USB) interface of the computing system, wherein the sled is slidable on the base between a retracted position and an inserted position in the direction; and the sled includes a grip and a retaining portion as a clamp operable via a fastener to retain a collar of a connector of the storage device while inserting into the retaining portion; and at least one of the sled and the base includes engagement features along a side edge to enable slidable engagement between the sled and the base.

2. The system of claim 1, wherein the sled is to retain the storage device at a collar portion of a connector extending from the storage device.

3. The system of claim 1, wherein the sled includes at least one lead-in portion to accommodate alignment tolerances and facilitate blind mating of the sled and the storage device to the interface.

4. The system of claim 1, wherein the sled is to selectively retain the storage device based on at least one fastener.

5. The system of claim 1, wherein the sled includes a grip feature to enable a user to manipulate the sled.

6. The system of claim 1, wherein at least one of the sled and the base includes engagement features to enable slidable engagement between the sled and the base.

7. The system of claim 1, wherein the base includes at least one lead-in portion to accommodate alignment tolerances and facilitate engagement between the sled and the base.

8. The system of claim 1, wherein the base is to slidably entrap the sled, to prevent the sled from being fully removed from the base after assembly of the sled with the base.

9. The system of claim 1, wherein the storage device integrates the sled features, such that the storage device also serves as the sled to slidably engage the base.

10. A computing system comprising: a housing enclosing a main board; a base mounted to the main board in a direction; and a sled to slidably engage with the base, wherein the sled is slidable on the base between a retracted position and an inserted position to enable a storage device of the sled to blind mate with a universal serial bus (USB) interface of the computing system in the direction; and the sled includes a grip and a retaining portion as a clamp operable via a fastener to retain a collar of a connector of the storage device while inserting into the retaining portion; and at least one of the sled and the base includes engagement features along a side edge to enable slidable engagement between the sled and the base.

11. The computing system of claim 10, wherein the base is integrated with the interface such that the base and interface are mountable to the main board together as a unitary assembly.

12. The computing system of claim 10, wherein the USB interface is mounted to a removable system board of the computing system, such that the base remains with the computing system on the main board independent of whether the removable system board is removed from the computing system.

13. The computing system of claim 10, wherein the housing of the computing system includes a lockable door to cover a receptacle containing the base in the computing system, to receive the sled in the receptacle.

14. A method, comprising: retaining a universal serial bus (USB) storage device at a sled by sliding in a direction; receiving the sled at a base mountable to a computing system; and blind mating the storage device with a USB interface of the computing system based on the sled being slidable in the direction on the base between a retracted position and an inserted position; and the sled includes a grip and a retaining portion as a clamp operable via a fastener to retain a collar of a connector of the storage device while inserting into the retaining portion; and at least one of the sled and the base includes engagement features along a side edge to enable slidable engagement between the sled and the base.

15. The method of claim 14, further comprising:
inserting a connector of the storage device through a retaining portion of the sled; and
retaining the storage device at the sled using a fastener.

16. The system of claim 1, wherein the multipurpose interface is a universal serial bus (USB) interface.

17. The system of claim 1, wherein the storage device is a USB storage device.

18. The method of claim 14, wherein the base receives the sled in a horizontal position.

19. The method of claim 14, wherein the storage device is blind mated to the USB interface in a horizontal position.

* * * * *